US008799698B2

(12) United States Patent
Singvall et al.

(10) Patent No.: US 8,799,698 B2
(45) Date of Patent: Aug. 5, 2014

(54) CONTROL OF DIGITAL VOLTAGE AND FREQUENCY SCALING OPERATING POINTS

(75) Inventors: Jakob Singvall, Bjärred (SE); Harald Bauer, Nuremberg (DE)

(73) Assignee: Ericsson Modems SA, Le Grand-Saconnex (CH)

(*) Notice: Subject to any disclaimer, the term of this patent is extended or adjusted under 35 U.S.C. 154(b) by 373 days.

(21) Appl. No.: 13/118,621

(22) Filed: May 31, 2011

(65) Prior Publication Data

US 2012/0306558 A1 Dec. 6, 2012

(51) Int. Cl.
*G06F 1/00* (2006.01)
*G06F 1/12* (2006.01)
*G06F 1/32* (2006.01)

(52) U.S. Cl.
USPC ........... 713/500; 713/300; 713/400; 713/322; 713/323

(58) Field of Classification Search
USPC .................. 713/300, 400, 322, 323; 323/318; 718/104; 702/64
See application file for complete search history.

(56) References Cited

U.S. PATENT DOCUMENTS

| | | | | |
|---|---|---|---|---|
| 6,535,986 | B1* | 3/2003 | Rosno et al. ................ | 713/400 |
| 7,596,709 | B2* | 9/2009 | Cooper et al. ............... | 713/323 |
| 2004/0128090 | A1 | 7/2004 | Read et al. | |
| 2006/0026447 | A1 | 2/2006 | Naveh et al. | |
| 2007/0250219 | A1* | 10/2007 | Gaskins et al. ............. | 700/299 |
| 2007/0288182 | A1* | 12/2007 | Douriet et al. .............. | 702/64 |
| 2008/0082844 | A1* | 4/2008 | Ghiasi et al. ................ | 713/323 |
| 2008/0136400 | A1* | 6/2008 | Chi et al. .................... | 323/318 |
| 2009/0049314 | A1* | 2/2009 | Taha et al. .................. | 713/300 |
| 2009/0135752 | A1 | 5/2009 | Su et al. | |
| 2009/0158060 | A1 | 6/2009 | Vaajala | |
| 2009/0300391 | A1* | 12/2009 | Jessup et al. ............... | 713/323 |
| 2010/0095137 | A1* | 4/2010 | Bieswanger et al. ....... | 713/300 |
| 2010/0162256 | A1* | 6/2010 | Branover et al. ........... | 718/104 |
| 2010/0250998 | A1 | 9/2010 | Herdrich et al. | |

(Continued)

FOREIGN PATENT DOCUMENTS

WO 2009/040760 A1 4/2009

OTHER PUBLICATIONS

PCT Search Report, mailed Aug. 21, 2012, in connection with International Application No. PCT/EP2012/058728.

(Continued)

*Primary Examiner* — Thomas Lee
*Assistant Examiner* — Aurel Prifti
(74) *Attorney, Agent, or Firm* — Leffler Intellectual Property Law, PLLC; Kenneth B. Leffler

(57) ABSTRACT

A clock signal for electronic circuitry is generated by generating, based on which one of a plurality of application use cases is presently active, a first signal that indicates a first selected one of a plurality of clock signal operating points. Based on the electronic circuitry's present speed requirement, a second signal is generated that indicates a second selected one of the clock signal operating points. For any given one of the application use cases, the speed requirement need not remain constant for the duration of the application use case. Based on whichever one of the first and second signals is associated with a higher clock frequency operating point, a third signal is generated that indicates which clock signal operating point (and possibly what voltage level) should be active. The third signal controls generation of a clock (and possibly also voltage level).

24 Claims, 5 Drawing Sheets

(56) References Cited

U.S. PATENT DOCUMENTS

2011/0314306 A1* 12/2011 Lin et al. .................. 713/300
2012/0045411 A1* 2/2012 Lapidot et al. ............ 424/85.1
2012/0054519 A1* 3/2012 Branover et al. .......... 713/322
2012/0110351 A1* 5/2012 Raju et al. ................. 713/300
2012/0117402 A1* 5/2012 Machnicki et al. ........ 713/322

OTHER PUBLICATIONS

PCT Written Opinion, mailed Aug. 21, 2012, in connection with International Application No. PCT/EP2012/058728.

* cited by examiner

CONTROL OF DIGITAL VOLTAGE AND FREQUENCY SCALING OPERATING POINTS

BACKGROUND

The present invention relates to the control of power expenditure in electronic circuitry, and more particularly to the control of clock frequency and voltage supply operating points in electronic circuitry.

Dynamic voltage and frequency scaling (DVFS) is a well-known principle in electronic circuit design: Clock frequency as well as voltage supply are scaled to the minimum values necessary to satisfy application performance requirements. Power savings occur across the total hardware component (not only at the clock related circuitry as for clock gating and frequency scaling techniques) and are significant due to the quadratic effect that voltage changes have on power consumption. A DVFS operating point (OPP) is defined by a predetermined clock frequency/voltage level pair. Several, or at least two, OPPs are defined for circuitry employing DVFS, with one of the OPPs being operative at any given time.

For a given circuit/component, selection of an OPP is made on a per application use case basis. Examples of use cases include, but are not limited to:
  a phone being used for making a call
  a phone being used for web browsing
  a phone being in idle mode (i.e., switched on but not being used and capable of responding to an incoming call Selection of an OPP for a given use case is guided by the following principles:
  It is desired to avoid selecting an OPP having too low a clock frequency and/or too low a supply voltage value because this may cause violation of application real-time constraints.
  It is desired to avoid selecting an OPP having a clock frequency and/or supply voltage value higher than that which is required to satisfy application requirements because this results in higher than necessary energy consumption. This is due to the fact that the higher the clock frequency, the higher the required supply voltage value, and this higher supply voltage value in turn results in higher energy consumption.

The inventors of the subject matter described herein have recognized that there are a number of problems with existing DVFS technology. One is that, with a limited number of defined OPPs, the mapping of application use cases to OPP may not be optimal. For example, assume that an embodiment has two defined OPPs, with OPP1 calling for a clock frequency of 100 MHz and OPP2 calling for a clock frequency of 50 MHz. Use cases that map to OPP1 (i.e., those with requirements calling for a clock frequency greater than 50 MHz) will therefore not benefit from DVFS because there will be no power reduction.

With the two OPPs as described, sub-optimal performance results because the worst case real time deadline within a use case will cause selection of the effective OPP to be OPP1 even if most of the time the use case can be running at a lower frequency.

Another detriment is that OPP frequency and voltage may be set early on in a project based on estimations of application requirements. Later on, due to changed requirements, the frequency and voltage may not be optimal from a power consumption perspective. It is therefore desired to have methods and apparatuses that achieve more optimal performance under the changed requirements.

The inventors of the subject matter described herein have further recognized that often a higher clock frequency is needed only for a very short period of time. However, switching from one OPP to another during this short period of time might result in significant overhead if OPP switching is implemented by means of a software-controlled processor.

An example of this problem arises in the context of the Long Term Evolution (LTE) system's "Micro Sleep". The basic idea is to power-down the receiver path in the radio as soon it is detected that no data packet needs to be received in the current transmission time interval (TTI). This requires decoding of the control channel as fast as possible using the highest possible clock frequency. In this use case, OPP1 is required only during decoding of the control channel. The remaining time, OPP2 can be used. As control channel decoding takes only a very short amount of time, changing from one OPP to another in a software-controlled implementation would cause a lot of overhead.

It is therefore desired to provide DVFS control mechanisms that provide for the use of optimal OPPs without the overhead found in conventional implementations.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, at least some of the foregoing and other objects are achieved in methods and apparatuses for generating a clock signal to be supplied to electronic circuitry. This involves generating, based on which one of a plurality of application use cases capable of being carried out by the electronic circuitry is presently active, a first signal that indicates a first selected one of a plurality of clock signal operating points should be active. Also, based on a present speed requirement of the electronic circuitry, a second signal is generated that indicates a second selected one of the plurality of clock signal operating points. For any given one of the application use cases, the present speed requirement need not remain constant for the duration of the given one of the application use cases. Based on the first and second signals, a third signal is generated that indicates which of the plurality of clock signal operating points should be active, wherein the clock signal operating point indicated by the third signal is whichever one of the clock signal operating points indicated by the first and second signals is associated with a higher clock signal frequency. The third signal is used to control generation of a clock signal having the operating point indicated by the third signal.

In some embodiments, the first signal further indicates a first selected one of a plurality of supply voltage levels; the second signal further indicates a second selected one of the plurality of supply voltage levels; the third signal further indicates which of the plurality of supply voltage levels should be active; and the third signal is used to control generation of a supply voltage level having the supply voltage level indicated by the third signal.

In some alternative embodiments, the first signal further indicates a first selected one of a plurality of supply voltage levels; the second signal further indicates a second selected one of the plurality of supply voltage levels; and generation of the clock signal further comprises generating, based on the first and second signals, a fourth signal that indicates which of the plurality of supply voltage levels should be active, wherein the supply voltage level indicated by the fourth signal is the most power consuming one of the supply voltage level indicated by the first signal and the supply voltage level indicated by the second signal; and using the fourth signal to control generation of a supply voltage level having the supply voltage level indicated by the fourth signal.

In some embodiments, the first signal has two states; the second signal has two states; and generating the third signal that indicates which of the plurality of clock signal operating points should be active comprises performing a logical OR between the first signal and the second signal.

In some embodiments, the first signal has more than two states and the second signal has more than two states.

In some embodiments, generating the first signal comprises using a programmed processor to select one of the plurality of clock signal operating points based on which of the plurality of application use cases is presently active; and generating the second signal comprises using a hardwired component to generate the second signal based on the present speed requirement of the electronic circuitry. In some but not necessarily all of these embodiments, the hardwired component is a timing generator.

In some embodiments, the electronic circuitry is configured to perform functions in a mobile communication equipment; and the present speed requirement of the electronic circuitry is a function of a timing characteristic of a signal received by the mobile communication equipment.

In some embodiments, the third signal is also used to control generation of one or more other clock signals, each having the clock signal operating point indicated by the third signal, wherein for any given one of the plurality of clock signal operating points, the clock signal and the one or more other clock signals operate at different frequencies relative to one another.

In some embodiments, the third signal is also used to control generation of one or more other supply voltage levels, wherein for any given one of the plurality of supply voltage levels, the generated supply voltage level and the generated one or more other supply voltage levels are different from one another.

In some embodiments, the second signal changes states while the first signal remains constant during the given one of the application use cases, whereby an average clock frequency during the given one of the application use cases is not equal to any one of a plurality of clock frequencies that respectively correspond to the clock signal operating points.

In some embodiments, generation of the second signal based on the present speed requirement of the electronic circuitry is inhibited, and instead the second signal is generated as a pulse width modulated signal having a duty cycle that is based on the presently active application use case. In some but not necessarily all of these embodiments, the first signal is caused to remain in a deasserted state for the duration of the presently active application use case.

BRIEF DESCRIPTION OF THE DRAWINGS

Objects and advantages of the invention will be understood by reading the following detailed description in conjunction with the drawings in which.

DETAILED DESCRIPTION

Figure 1:
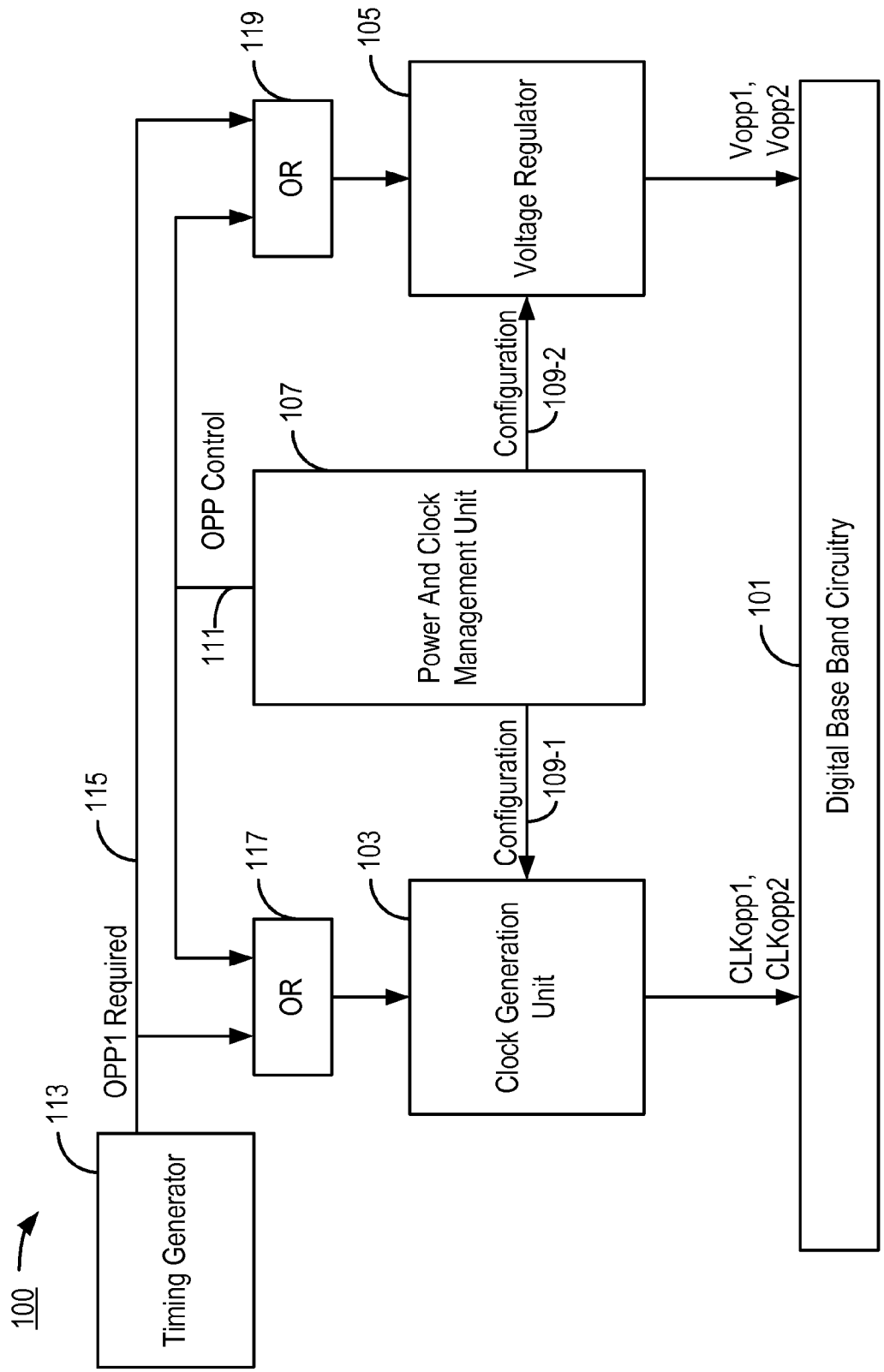
FIG. 1 is a block diagram of an exemplary circuit employing features consistent with some embodiments of the invention.

Various features of the invention will now be described with reference to the figures, in which like parts are identified with the same reference characters.

Various aspects of the invention will now be described in greater detail in connection with a number of exemplary embodiments. To facilitate an understanding of inventive aspects, many of these aspects are described in terms of sequences of actions to be performed by elements of a computer system or other hardware capable of executing programmed instructions. It will be recognized that in each of the embodiments, the various actions could be performed by specialized circuits (e.g., analog and/or discrete logic gates interconnected to perform a specialized function), by one or more processors programmed with a suitable set of instructions, or by a combination of both. The term "circuitry configured to" perform one or more described actions is used herein to refer to any such embodiment (i.e., one or more specialized circuits and/or one or more programmed processors). Moreover, the inventive aspects can additionally be considered to be embodied entirely within any form of computer readable carrier, such as solid-state memory, magnetic disk, or optical disk containing an appropriate set of computer instructions that would cause a processor to carry out the techniques described herein. Thus, the various aspects of the invention may be embodied in many different forms, and all such forms are contemplated to be within the scope of the invention. For each of the various inventive aspects, any such form of embodiments as described above may be referred to herein as "logic configured to" perform a described action, or alternatively as "logic that" performs a described action.

In one respect, some embodiments consistent with the invention create what might be considered a "virtual OPP" that can be optimized for every specific use case by, within a given use case, switching between two or more predefined OPPs in a manner akin to pulse width modulation (PWM).

In another aspect of some but not necessarily all embodiments, switching between OPPs is by means of a hardware timer operating in PWM mode, with the duty cycle determining the virtual OPP.

In still another aspect of some but not necessarily all embodiments, hardware timer controlled switching to a high OPP ("high" in the sense of high frequency/high voltage) is performed only during time periods in which high performance is required to meet certain system deadlines.

These and other aspects are now described in further detail in the following.

FIG. 1 is a block diagram of an exemplary circuit 100 employing features consistent with some embodiments of the invention. For the sake of example, it is assumed that the circuitry whose clock speed and voltage are dynamically controlled is digital baseband circuitry 101, such as is found in wireless communication equipment. However, the invention is not limited to this application, but can instead be applied in any context utilizing DVFS techniques.

The digital base band circuitry 101 receives a clock signal having one of two frequencies (wherein each of the frequencies can be considered to be a respective one of two clock signal operating points, denoted fopp1 and fopp2). The clock signal having the frequency associated with fopp1 is herein denoted CLKopp1 and the clock signal having the frequency associated with fopp2 is herein denoted CLKopp2. The clock signal CLKopp1/CLKopp2 is supplied by a clock generation unit 103. In alternative embodiments, the digital base band circuitry 101 could receive a clock signal having any one of three or more frequencies; this exemplary embodiment is limited to two just to facilitate the reader's understanding of features found in embodiments consistent with the invention.

The digital base band circuitry 101 also receives a supply voltage having one of two supply voltage levels, denoted Vopp1 and Vopp2, supplied by a voltage regulator 105. The two supply voltage levels Vopp1 and Vopp2 differ in magnitude from one another, and could be considered to be two supply voltage operating points of the supply voltage regulator that produces the supply voltage levels. In alternative embodiments, the digital base band circuitry 101 could receive a supply voltage having any one of three or more voltage levels; this exemplary embodiment is limited to two just to facilitate the reader's understanding of features found in embodiments consistent with the invention.

To further facilitate the discussion, only a single clock signal and a single supply voltage are shown. This is not an essential aspect of the invention. The various aspects described herein can be applied to embodiments having more than one clock signal and/or more than one voltage supply.

In this example, each of the clock signal operating points (and consequently each of the clock frequencies) is paired with a respective one of the supply voltage levels such that CLKopp1 is paired with Vopp1 to form a first operating point, OPP1, and CLKopp2 is paired with Vopp2 to form a second operating point, OPP2. To achieve this, operation of the clock generation unit 103 is coordinated with the operation of the voltage regulator 105. This coordination is brought about by means of a power and clock management unit 107, which generates configuration signals 109-1, 109-2, that are supplied to control inputs of the clock generation unit 103 and voltage regulator 105, respectively. The functionality of the power and clock management unit 107 can be, but does not have to be, implemented as software (i.e., a set of program instructions), stored on a non-transitory processor readable storage medium. The software-implemented functionality is carried out when the software is executed by one or more processors (e.g., a micro-controller) associated with the power and clock management unit 107. In alternative embodiments, hardwired circuitry alone or in combination with one or more programmed processors is used.

After an initialization triggering event (e.g., a power-on reset of the device), the power and clock management unit 107 configures the clock frequencies and voltages for OPP1 and OPP2. An exemplary configuration operation involves the power and clock management unit 107 reading data from a one-time-programmable (OTP) memory device, wherein the OTP memory device has, during production of the IC, been programmed with the voltages required to achieve a certain clock frequency. This data is used as a basis from which the clock frequencies to be generated by the clock generation unit 103 for OPP1 or OPP2 and the voltage levels to be generated by the voltage regulator 105 for OPP1 or OPP2 are programmed.

During operation, the power and clock management unit 107 selects (by means of software in the exemplary embodiment) either OPP1 or OPP2 to be the currently active operating point. For any given one of the application use cases, the speed requirement can vary from the start of the given application use case to the end of the application use case. Therefore, the power and clock management unit's selection of an operating point for use within a use case is based on the highest required performance that is required during those portion(s) (there may be only one portion) of a time period that are outside relatively short intervals during which peak performance requirements are recognized and controlled not by the power and clock management unit 107, but instead by a timing generator 113 (discussed below).

In the exemplary embodiment, the power and clock management unit 107 outputs a control signal, herein denoted "OPP control signal" 111, that, when asserted, calls for the highest performance OPP (e.g., OPP1) to be the operative OPP for the clock generation unit 103 and the voltage regulator 105. In this respect, "highest performance" is also associated with a highest level of power consumption, since there is a direct relationship between the level of performance and the consumption of power.

When not asserted, the OPP control signal 111 will not cause OPP1 to be the active operating point for the clock generation unit 103 and voltage regulator 105. However, this does not necessarily mean that OPP2 will be active because, operating in parallel with the power and clock management unit 107 is the timing generator 113 mentioned above. The timing generator 113 generates a signal, herein denoted the "OPP1 Required signal" 115, that, when asserted, instructs the circuitry to make the highest performing operating point, OPP1, the active operating point irrespective of the state of the OPP control signal 111.

In the exemplary embodiment, the ability of the OPP1 Required signal 115 to override the operating point called for by the OPP control signal 111 is brought about by means of first and second logical OR gates 117, 119. The first logical OR gate 117 has as its two inputs the OPP Control signal 111 and the OPP Required signal 115. An output signal from the first logical OR gate 117 is supplied to a control input port of the clock generation unit 103. If either or both of the OPP1 Control signal 111 and OPP1 Required signal 115 are asserted, the output of the first logical OR gate 117 will also be asserted which, in turn, causes the clock generation unit 103 to supply CLKopp1 to the digital baseband circuitry 101. If neither of the OPP1 Control signal 111 and OPP1 Required signal 115 are asserted, then the output of the first logical OR gate 117 is likewise not asserted which, in turn, causes the clock generation unit 103 to supply CLKopp2 to the digital baseband circuitry 101.

In a similar manner, the second logical OR gate 119 has as its two inputs the OPP Control signal 111 and the OPP Required signal 115. An output signal from the second logical OR gate 119 is supplied to a control input port of the voltage regulator 105. If either or both of the OPP1 Control signal 111 and OPP1 Required signal 115 are asserted, the output of the second logical OR gate 119 will also be asserted which, in turn, causes the voltage regulator 105 to supply Vopp1 to the digital baseband circuitry 101. If neither of the OPP1 Control signal 111 and OPP1 Required signal 115 are asserted, then the output of the second logical OR gate 117 is likewise not asserted which, in turn, causes the voltage regulator 105 to supply Vopp2 to the digital baseband circuitry 101.

It will be appreciated that, in the exemplary embodiment, the first logical OR gate 117 and the second logical OR gate 119 are depicted as being distinct from one another. However, recognizing that these two logic elements receive the same input signals and perform the same function, more efficient designs can be implemented using only a single logical OR gate that supplies its output to each of the clock generation unit 103 and the voltage regulator 105.

It will be appreciated that, by having two concurrently and independently operating selectors of an operating point (e.g., the power reset clock management unit 107 and the timing generator 113) with one basing decisions on overall use case requirements (with the decision being stable over the duration of the use case) and the other being responsive to an immediate/present speed requirement of the affected electronic circuitry, with the highest performance requirement selection taking precedence over the lower one, transitory high performance requirements can be satisfied without having to carry out this level of power consumption through other parts of a use case duration. The effect is comparable to a pulse width modulation of the clock frequency with a resulting average clock frequency over the duration of the use case that is a virtual operating point. The average frequency is not equal to any of the actually defined clock signal frequencies.

An advantage of having two concurrently and independently operating selectors of an operating point as described above is the ability to enable fast switching between operating points without having to have the overhead of very complicated all hardware embodiments or of very heavy requirements on an all-software implementation.

Figure 2:
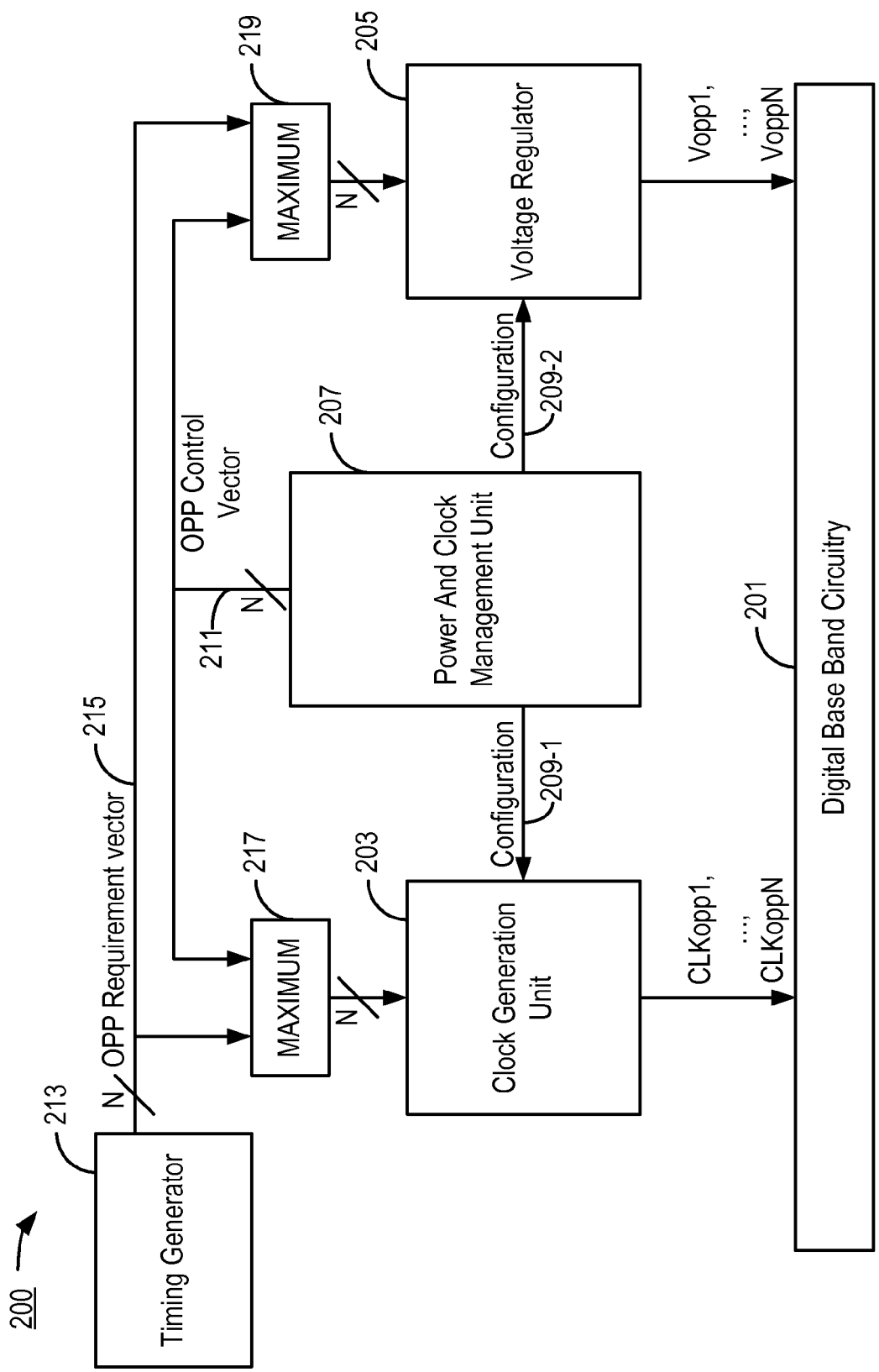
FIG. 2 is a block diagram of an alternative exemplary circuit employing features consistent with some embodiments of the invention.

FIG. 2 is a block diagram of an alternative exemplary circuit 200 employing features consistent with some embodiments of the invention. The digital base band circuitry 101 can be the same as that shown in FIG. 1, although this is not an essential aspect of the invention. However, in this exemplary embodiment, the case of two distinct OPPs per use case has been generalized to enable any plurality of OPPs per use case.

For the sake of example, it is assumed that the circuitry whose clock speed and voltage are dynamically controlled is digital baseband circuitry 201, such as is found in wireless communication equipment. However, the invention is not limited to this application, but can instead be applied in any context utilizing DVFS techniques.

The digital base band circuitry 201 receives a clock signal having one of a plurality, herein denoted N, of frequencies (wherein each of the N frequencies can be considered to be a respective one of N clock signal operating points, denoted fopp1, . . . , foppN). The clock signal having the frequency associated with fopp1 is herein denoted CLKopp1 and this nomenclature is carried forth through the clock signal having the frequency associated with foppN, which is herein denoted CLKoppN. The clock signal CLKopp1, . . . , CLKoppN is supplied by a clock generation unit 203.

The digital base band circuitry 201 also receives a supply voltage having one of N supply voltage levels, denoted Vopp1 though VoppN, supplied by a voltage regulator 205. The N supply voltage levels Vopp1 through VoppN differ in magnitude from one another.

To further facilitate the discussion, only a single clock signal and a single supply voltage are shown. This is not an essential aspect of the invention. The various aspects described herein can be applied to embodiments having more than one clock signal and/or more than one voltage supply.

In this example, each of the clock signal operating points is paired with a respective one of the supply voltage levels such that CLKopp1 is paired with Vopp1 to form a first operating point, OPP1, CLKopp2 is paired with Vopp2 to form a second operating point, OPP2, and so on up to CLKoppN being paired with VoppN to form an $N^{th}$ operating point. That is, each pair of frequency and voltage level operating points can, itself, be considered to be an operating point. To achieve this pairing of clock signal operating points (i.e., frequencies) with voltage level operating points (i.e., voltage levels), operation of the clock generation unit 203 is coordinated with the operation of the voltage regulator 205. This coordination is brought about by means of a power and clock management unit 207, which generates configuration signals 209-1, 209-2, that are supplied to control inputs of the clock generation unit 203 and voltage regulator 205, respectively. The functionality of the power and clock management unit 207 can be, but does not have to be, implemented as software (i.e. a set of program instructions), stored on a non-transitory processor readable storage medium. The software-implemented functionality is carried out when the software is executed by one or more processors (e.g., a micro-controller) associated with the power and clock management unit 207. In alternative embodiments, hardwired circuitry alone or in combination with one or more programmed processors is used.

After an initialization triggering event (e.g., a power-on reset of the device), the power and clock management unit 207 configures the clock frequencies and voltages for the operating points OPP1 through OPP_N. An exemplary configuration operation involves the power and clock management unit 207 reading data from a one-time-programmable (OTP) memory device, wherein the OTP memory device has, during production of the IC, been programmed with the voltages required to achieve a certain clock frequency. This data is used as a basis from which the clock frequencies to be generated by the clock generation unit 203 for OPP1 through OPP_N and the voltage levels to be generated by the voltage regulator 205 for OPP1 through OPP_N are programmed.

During operation, the power and clock management unit 207 selects (by means of software in the exemplary embodiment) one of the N operating points, OPP1 through OPP_N to be the currently active operating point. As mentioned earlier, for any given one of the application use cases, the speed requirement can vary from the start of the given application use case to the end of the application use case. Therefore, the power and clock management unit's selection of an operating point for use within a use case is based on the highest required performance that is required during those portion(s) (there may be only one portion) of a time period that are outside relatively short intervals during which peak performance requirements are recognized and controlled not by the power and clock management unit 207, but instead by a timing generator 213 (discussed below).

In the exemplary embodiment, the power and clock management unit 207 outputs a control signal vector, herein denoted "OPP control vector" 211, that, when asserted, indicates the minimum level of performance (ranging from OPP1 through OPP_N) that, from the point of view of the power and clock management unit 207, needs to be the operative OPP defined by the performance of the clock generation unit 203 and the voltage regulator 205. In the exemplary embodiment, the OPP control vector 211 is in the form of N distinct signals, but in alternative embodiments fewer signal lines could be employed, with the particular one of the N defined OPPs being encoded onto these fewer signal lines.

However, the OPP designated by the OPP control vector 211 will not necessarily be the active operating point because, operating in parallel with the power and clock management unit 207 is the timing generator 213 mentioned above. The timing generator 213 generates a signal vector, herein denoted the "OPP Requirement vector" 215, that, indicates the minimum level of performance (ranging from OPP1 through OPP_N) that, from the point of view of the timing generator 213, needs to be the operative OPP defined by the performance of the clock generation unit 203 and the voltage regulator 205. In the exemplary embodiment, the OPP requirement vector 215 is in the form of N distinct signals, but in alternative embodiments fewer signal lines could be employed, with the particular one of the N defined OPPs being encoded onto these fewer signal lines.

Selection of an active OPP is made by first circuitry 217 and second circuitry 219 that each perform a "maximum" function (herein denoted "maximum circuitry"). Each of the first maximum circuitry 217 and the second maximum circuitry 219 has two inputs: the OPP control vector 211 and the OPP requirement vector 215. The first maximum circuitry 217 and the second maximum circuitry determines which one of these vectors is presently indicating a higher level of performance, and outputs a vector to denote the OPP having that level of performance. In the exemplary embodiment, the output of the first maximum circuitry 217 and that of the second maximum circuitry 219 is an N-signal vector, with only one of the N signals being asserted to indicate which of the N OPPs is being selected. However, in alternative embodiments, an encoding of the N possibilities can be made on fewer than N physical lines.

The output vector from the first maximum circuitry 217 is supplied to a control input port of the clock generation unit 203. The output of the clock generation unit 203 will thereby supply one of the clock signals, CLKopp1 through CLKoppN to the digital baseband circuitry 201, with the one selected corresponding to the highest one selected as between the power and clock management unit 211 and the timing generator 213.

In a similar manner, the output vector from the second maximum circuitry 219 is supplied to a control input port of the voltage regulator 205. The output of the voltage regulator 205 will thereby supply one of the voltage levels, Vopp1 through VoppN to the digital baseband circuitry 201, with the one selected corresponding to the highest one selected as between the power and clock management unit 211 and the timing generator 213.

It will be appreciated that, in the exemplary embodiment, the first maximum circuitry 217 and the second maximum circuitry 219 are depicted as being distinct from one another. However, recognizing that these two units receive the same input vectors and perform the same function, more efficient designs can be implemented using only a single maximum circuitry function that supplies its output to each of the clock generation unit 203 and the voltage regulator 205.

Figure 3:
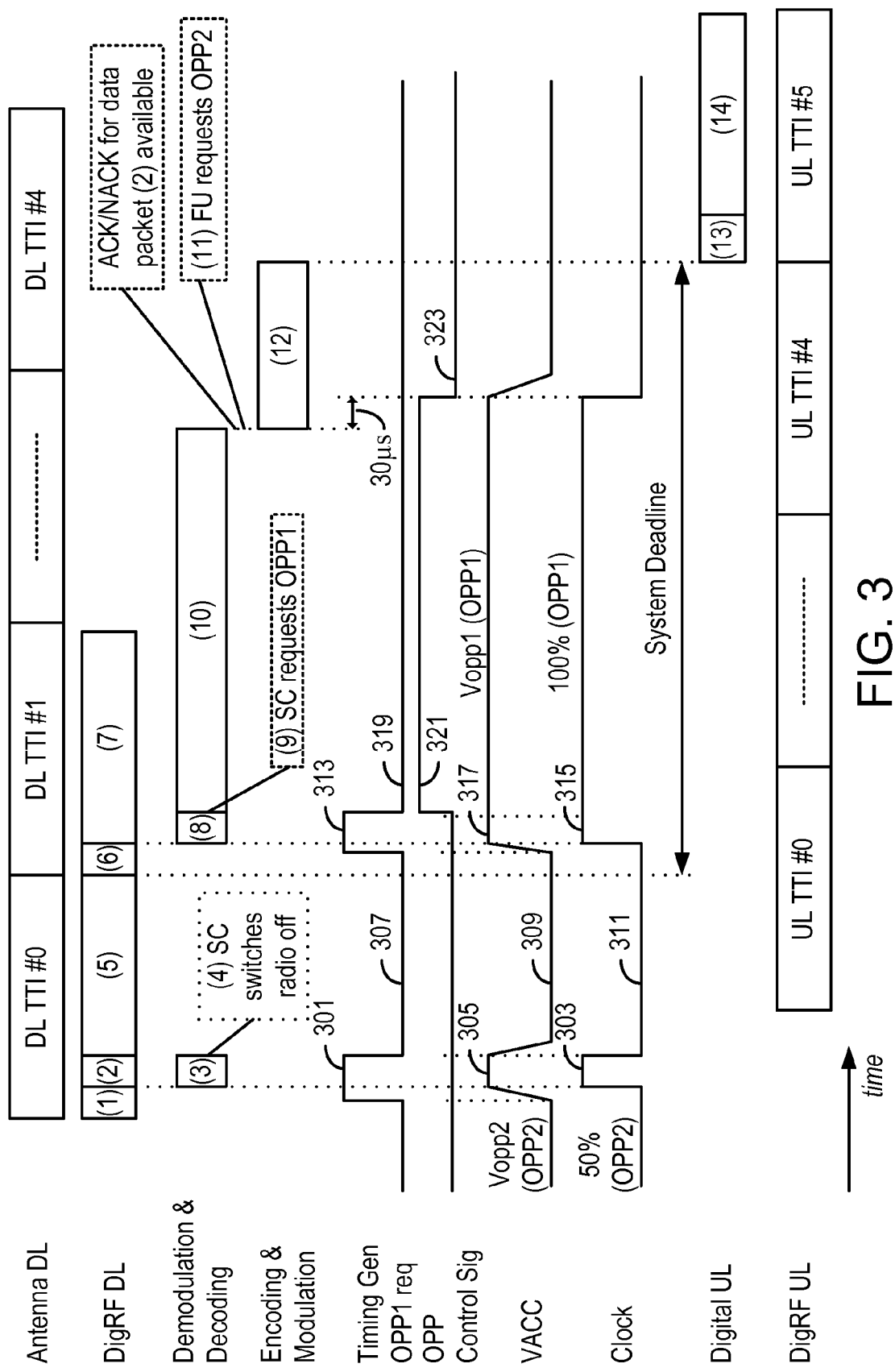
FIG. 3 is a signal timing diagram showing signals received, transmitted, and generated within an exemplary embodiment such as that which is illustrated in FIG. 1.

To further illustrate aspects of embodiments consistent with the invention, FIG. 3 is a signal timing diagram showing signals received, transmitted, and generated within an exemplary embodiment such as that which is illustrated in FIG. 1. For the sake of example, these signals implement the LTE micro-sleep function mentioned earlier, using HW-controlled OPP switching as described above. At the beginning of the example, the power and clock management unit 107 outputs a de-asserted OPP control signal (not shown in FIG. 3), so that unless the timing generator 113 asserts its OPP1 required signal 115 or the power and clock management unit 107 asserts its OPP control signal 111, the active operating point will be OPP2 (i.e., low speed/low power consumption).

In step (1), a downlink (DL) control channel for a first TTI (TTI #0) is received from a radio air interface via Digital RF circuitry ("DigRF interface").

In step (2), a data packet for TTI #0 is started to be received via the DigRF interface.

In step (3), the downlink control channel for TTI #0 is demodulated and decoded. Because high speed operation is required for this process, the timing generator 113 is configured to assert the OPP1 required signal (301) so that OPP1 is selected during this time period (i.e., the clock generation unit 103 receives a control signal 303 that causes it to output the clock signal CLKopp1, and the voltage regulator 105 receives a control signal 305 that causes it to output a voltage level of Vopp1).

In step (4), a session coordinator (a software component, not shown) detects that no packet needs to be received. In response to this detection, it switches off the radio and the DigRF interface, putting the equipment into a "micro-sleep" state.

In step (5), the radio receiver path and DigRF are powered down until the end of TTI #0, so no packet is received ("micro-sleep"). During this time period, the timing generator 113 is configured to de-assert the OPP1 required signal (307) so that OPP1 is not selected during this time period (i.e., the clock generation unit 103 receives a control signal 309 that causes it to output the clock signal CLKopp2, and the voltage regulator 105 receives a control signal 311 that causes it to output a voltage level of Vopp2).

Following the end of TTI #0, the radio receiver path and DigRF are powered back up (not shown) so that, in step (6), the downlink control channel for TTI #1 is received from the radio air interface via the DigRF interface.

In step (7), a data packet for TTI #1 is received via the DigRF interface.

In step (8), the downlink control channel for TTI #1 is demodulated and decoded. Because high speed operation is required for this process, the timing generator 113 is configured to assert the OPP1 required signal (313) so that OPP1 is selected during this time period (i.e., the clock generation unit 103 receives a control signal 315 that causes it to output the clock signal CLKopp1, and the voltage regulator 105 receives a control signal 317 that causes it to output a voltage level of Vopp1).

In step (9), the session coordinator becomes aware from the demodulation and decoding of the downlink control channel for TTI #1 that a large downlink packet needs to be demodulated and decoded. It requests higher performance for the involved functional units (FUs—implemented in hardware and/or software) from the resource manager (a software component, not shown). This request can be made as soon as the need becomes known, or alternatively the request can be made later (e.g., just prior to execution of the (turbo) decoder).

As a consequence, in step (10), even though the timing generator 113 has de-asserted the OPP1 required signal (319), the power and clock management unit 107 asserts its OPP control signal 111 (321), so high performance is maintained while the packet is being received.

The received data packet is demodulated and decoded. Demodulation and decoding begins even before the OPP switching (i.e., the ramping up voltage from Vopp2 to Vopp1 and changing clock frequency from fopp2 to fopp1) triggered in step (9) is completed.

In step (11), after demodulation and decoding have completed, the power and reset management unit releases the requests for higher performance from step (9). As a consequence, a resource manager (RM—a software component) triggers switching back from OPP1 to OPP2 (e.g., the OPP control signal 111 is de-asserted (323) and the OPP required signal 115 remains de-asserted).

In step (12), the acknowledgement (ACK) or negative acknowledgement (NACK) information from step (5) is encoded and modulated.

In step (13), the ACK/NACK information is transmitted via the DigRF interface to the radio.

In step (14), a potential uplink (UL) data packet is transmitted via the DigRF interface to the radio.

Figure 4:
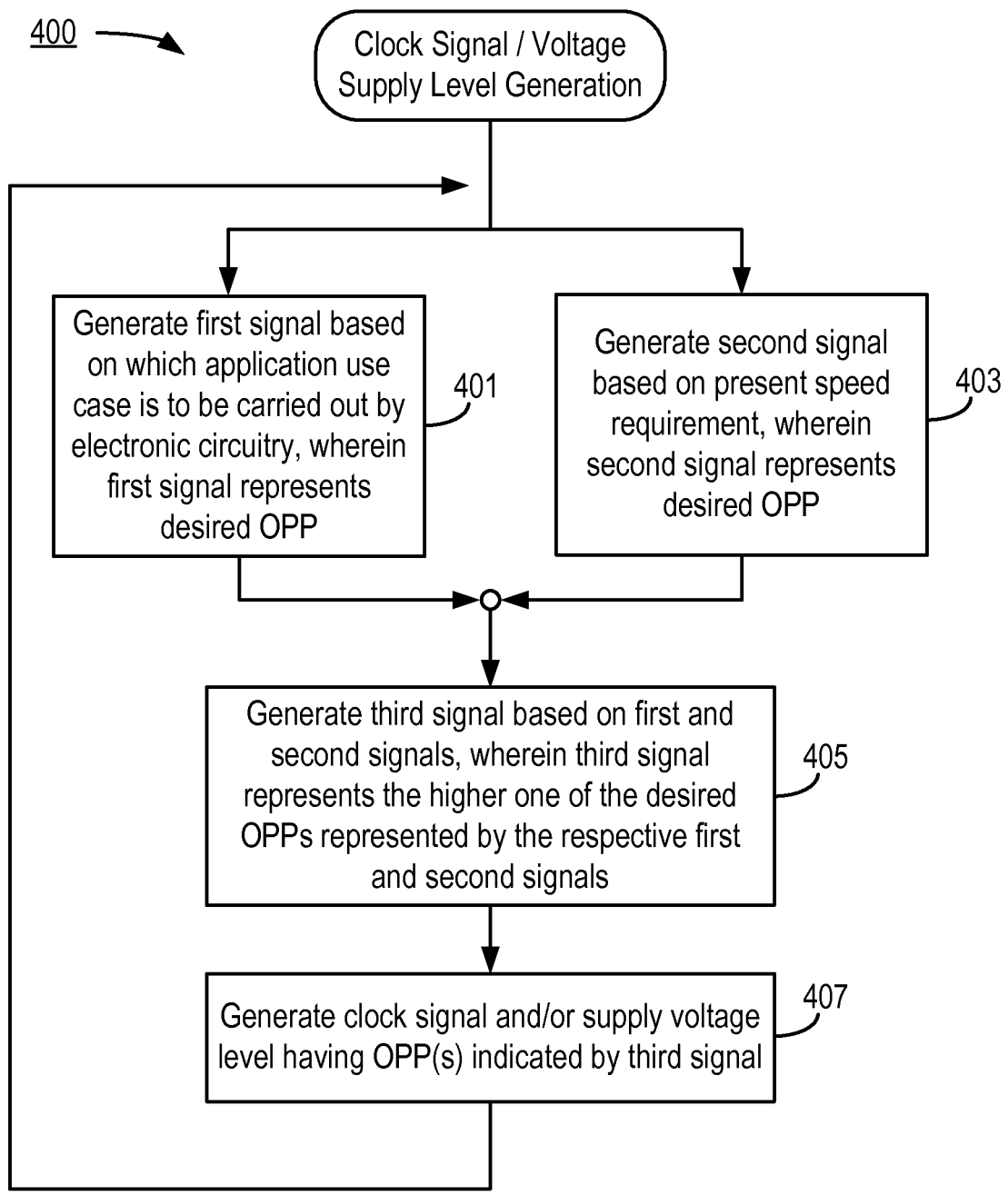
FIG. 4 is, in one respect, a flow diagram of steps/processes performed in accordance with some embodiments of the invention.

To even further illustrate aspects of embodiment consistent with the invention, FIG. 4 is, in one respect, a flow diagram of steps/processes performed in accordance with some embodiments of the invention. FIG. 4 is, in another respect, a block diagram of circuitry 400, configured to carry out generation of a clock signal and/or a voltage supply signal by means of the various functionally described elements depicted in the figure.

As shown in the figure, two operations are carried out concurrently. In one of these, a first signal is generated based on which application use case is to be carried out by the electronic circuitry to which the clock signal and/or supply voltage are to be supplied (step 400). The first signal represents a desired OPP for the clock signal and/or supply voltage to be generated, and is exemplified by the OPP Control signal 111 of FIG. 1 and by the OPP Control vector 211 of FIG. 2.

In the other of the two concurrently performed operations, a second signal is generated based on a present speed requirement of the electronic circuitry to which the clock signal and/or supply voltage are to be supplied (step 403). The second signal represents a desired OPP for the clock signal and/or supply voltage to be generated, and is exemplified by the OPP Requirement signal 115 of FIG. 1 and by the OPP Requirement vector 215.

It will therefore be understood that, depending on particular implementation details, each of the first and second signals can represent any one of a plurality of OPPs.

Because the first signal is generated based on which of a plurality of application use cases to be carried out by the electronic circuitry is presently active, generating the first signal can be carried out by a programmed processor (e.g., either of the power and clock management units 107, 207 shown in FIGS. 1 and 2). In order to achieve difficult timing requirements, it is advantageous for the second signal to be generated by hardwired component(s)/circuitry (e.g., either of the timing generators 113, 213 depicted in FIGS. 1 and 2).

The first and second signals are then used as a basis for generating a third signal, wherein the third signal represents the higher one of the desired OPPs represented by the respective first and second signals (step 405). As used herein, the term "higher" refers to clock speed and voltage requirements (i.e., in the context of clock speed, "higher" means "faster"; in the context of supply voltage level, "higher" means higher in magnitude regardless of polarity); "higher" does not refer to signal level of the first, second or third signals, since the very same aspects can be implemented by means of negatively asserted logic as well as positively asserted logic. The third signal is exemplified by the output signal from either one of the first and second logical OR gates 117, 119, and also by the output signal from either one of the first maximum circuitry 217 and the second maximum circuitry 219.

The clock signal and/or supply voltage are then generated having the OPP(s) indicated by the third signal. Exemplary clock signals are depicted as any of the signals CLKopp1, CLKopp2, . . . , CLKoppN depicted in FIGS. 1 and 2 (where N is greater than or equal to 2). Exemplary supply voltages are depicted as any of the voltage levels Vopp1, Vopp2, . . . VoppN depicted in FIGS. 1 and 2 (where N is greater than or equal to 2).

Having generated the clock signal and/or the supply voltage, the process is repeated, beginning at step 401. It will be appreciated that during any one application use case, the first signal will remain constant. However, for any given one of the application use cases, the speed requirement can vary from the start of the given application use case to the end of the application use case. This is illustrated in FIG. 3 by the signal levels 301 and 307, in which, for the use case associated with "LTE micro-sleep", a high speed requirement is always required to quickly demodulate and decode a received control channel signal (signal levels 301 and 313), but beyond that the high speed requirement is not unconditional (signal levels 307 and 319). In principle, the system would be functional even if the control channel were to be decoded more slowly (e.g., using OPP2), but by decoding it quickly (e.g., using OPP1), it is possible to earlier ascertain whether the radio can be switched off, thereby consuming less energy.

Various aspects of embodiments consistent with the invention provide advantages over conventional designs. For example, fast switching between OPPs is made possible, which results in lower power consumption due to the fact that energy consumption can be boosted momentarily as needed to satisfy peak performance requirements, and then reduced to permit lower clock speeds that are sufficient to satisfy predominant speed requirements during a use case time interval.

Virtual OPPs are also made possible as a result of the switching that takes place between two OPPs. This switching creates a "virtual" OPP that corresponds to the average frequency that is achieved during the time interval of the use case. The virtual OPP can be optimized for every specific use case. The average clock frequency (and related supply voltage level) can be adjusted per use case at any time (e.g., in the event of increased application requirements due to improved algorithms or incorrect initial design estimates).

Another advantage is the ability to meet real time deadlines with low average frequency. Switching between OPPs is adapted to close real time requirements by applying high clock frequency (and when called for, higher supply voltage level) during execution of time critical operation(s). During periods without (local) real time deadlines, the clock frequency is lowered to meet the overall deadlines.

As a result of these characteristics, there is achieved a reduction in overhead that would otherwise be introduced by software-based OPP switching solutions.

Figure 5:
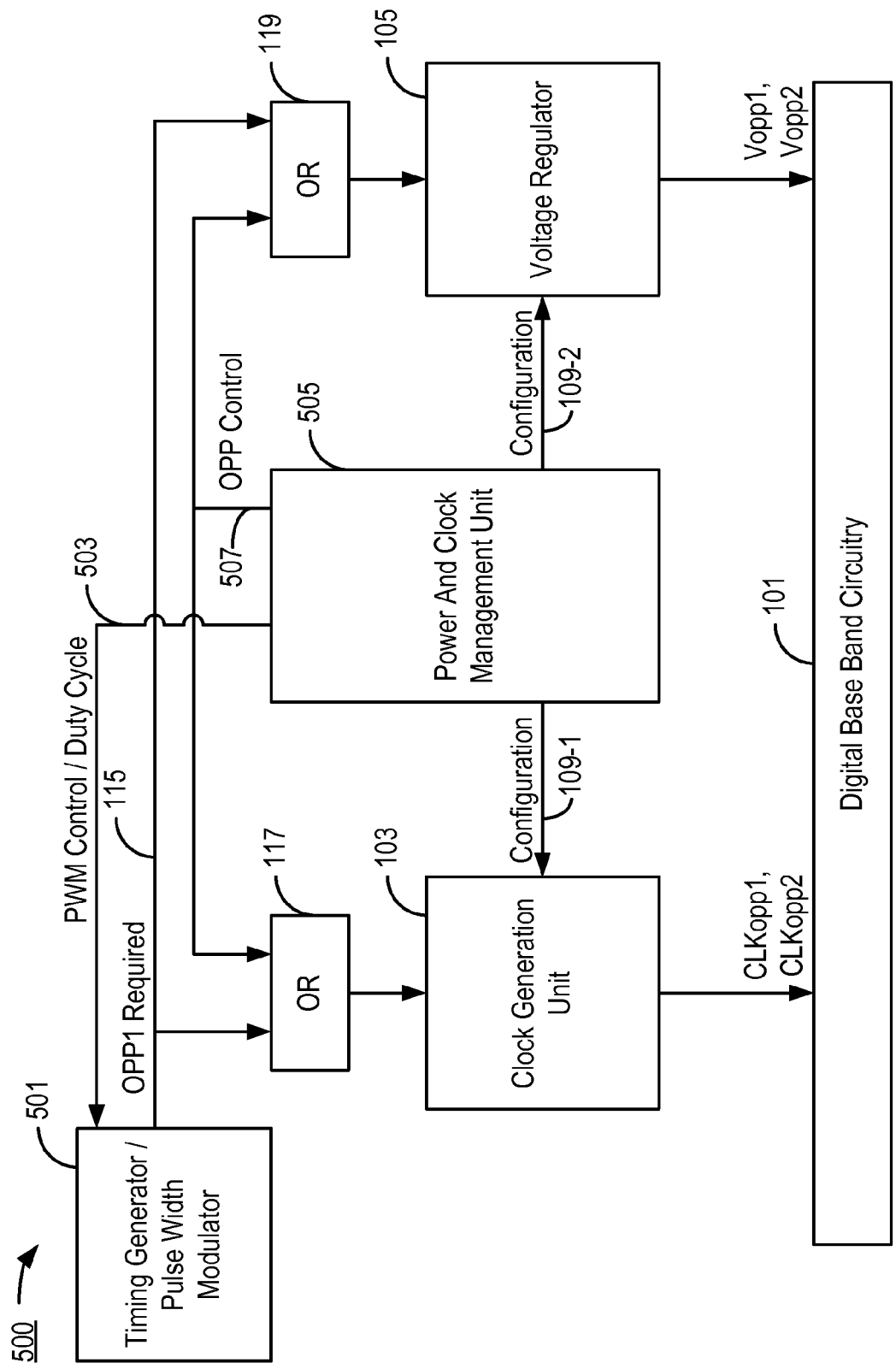
FIG. 5 is a block diagram of an exemplary circuit employing features consistent with some alternative embodiments of the invention.

In yet another aspect, virtual OPP capability is further enhanced in some alternative embodiments, such as the exemplary circuit 500 depicted as a block diagram in FIG. 5. In this embodiment, many of the same features and components are the same as those illustrated and described with reference to FIG. 1, thereby making a repeated description of these features and components unnecessary. However, in this exemplary embodiment, a timing generator component is used that is not only capable of being operated in the manner exactly as described earlier with respect to the timing generator 113, but is also capable of performing solely as a pulse width modulator. This component is herein referred to as a timing generator/pulse width modulator 501. Whether the timing generator/pulse width modulator 501 operates in the manner described with respect to the timing generator 113 or operates as a pulse width modulator is controlled by a control signal, herein denoted "PWM Control/Duty Cycle" signal 503, that is generated by the power and clock management unit 505. In response to the PWM Control/Duty Cycle signal 503 indicating a pulse width modulator mode of operation, the generation of the OPP1 Required signal 115 based on a present speed requirement of the electronic circuitry (e.g., the digital baseband circuitry 101) is inhibited, and instead the OPP1 Required signal 115 is generated simply as a signal having a duty cycle indicated by the PWM Control/Duty Cycle signal 503.

The power and clock management unit 505 also generates an OPP Control signal 507 that is analogous to the OPP Control signal 111. While the OPP Control signal 111 and OPP Control signal 507 can be considered to affect the operation of the remainder of the circuit in the same way, they can differ in how they are generated (i.e., when they are asserted or deasserted) owing to the fact that the power and clock management unit 505 is configured to be "aware" of its ability to influence the generated clock frequency (and corresponding voltage level) by means of the pulse width modulation capability of the timing generator/pulse width modulator 501, as will now be described.

When the power and clock management unit 505 instructs the timing generator/pulse width modulator 501 to act as a pulse width modulator, the PWM Control/Duty Cycle signal 503 informs the timing generator/pulse width modulator 501 of the duty cycle at which the OPP1 Required signal 115 is to be asserted (or in alternative embodiments, deasserted). By asserting the OPP1 Required signal 115 in compliance with the indicated duty cycle, and assuming that the OPP Control signal 507 is held in a deasserted state (thereby effectively eliminating the need for OR gates 117 and 119 from the circuitry), the clock generation unit 103 can be caused to switch back and forth between generating the CLKopp1 and CLKopp2 at a rate in correspondence with the indicated duty cycle. (The voltage regulator also switches back and forth between generation of Vopp1 and Vopp2 at the same rate.) In this manner, a virtual clock and/or voltage level operating point is achieved without requiring physical hardware components to actually generate the effective clock frequencies and voltage levels.

It will be appreciated that the OPP Control signal 507 need not be held in a deasserted state as described in the example above, but can, under the direction of the power can clock management unit 505, be asserted or deasserted as required for a particular use case, thereby increasing the flexibility of the overall circuitry to meet the processing needs in a power efficient manner.

In yet other alternative embodiments, the timing generator/pulse width modulator 501 can effectively generate the plurality of operating points, such as the N operating points illustrated with respect to FIG. 2, by means of duty cycle control of the pulse width modulated output signal instead of generating the plurality of output signals such as those illustrated with respect to FIG. 2 (the OPP1 Requirement Vector 215).

The various features, such as those described with reference to FIG. 1 and those described with reference to FIG. 5 can be used in combination (i.e., sometimes relying exclusively on pulse width modulation to create a virtual operating point, sometimes relying on the Timing Generator/Pulse Width Modulator 501 and the Power and Clock Management Unit 505 to, in combination, exclusively control which operating point will be in effect at any moment in time as described earlier with reference to FIG. 1, and sometimes relying on all of these in combination as required by any given use case to quite efficiently satisfy processing requirements.)

The invention has been described with reference to particular embodiments. However, it will be readily apparent to those skilled in the art that it is possible to embody the invention in specific forms other than those of the embodiment described above.

For example, some of the above-described embodiments employ one or more logical OR gates to ascertain which of the OPP Control signal 111 and the OPP requirement signal 115 indicates the higher OPP requirement. In these embodiments, it is assumed that a logical "1" represents a higher OPP requirement. However, it will be readily apparent that equivalent embodiments can be constructed by, for example, allowing a logical "0" to represent the higher performance requirement and utilizing a logical NAND gate instead of the logical OR gate 117, 119.

In another example, the above-described embodiments have all assumed that an OPP represents a pairing of a clock frequency OPP and a voltage supply level OPP. However, this is not an essential aspect of the invention. It is anticipated that, for example, in some embodiments it may be possible and advantageous to switch between different clock frequencies without having to change the supply voltage level, and vice versa. In such embodiments, the various aspects of embodiments consistent with the invention can be applied to the generation of only the clock signal or to the voltage supply level, but not both.

In yet another example, the exemplary embodiments described above illustrate various aspects in the context of the generation of a single clock signal and of a single voltage supply level to be used at any given moment. However, this is not an essential aspect of the invention. To the contrary, alternative embodiments may involve the concurrent generation of a plurality of clock signals to be used for different parts of the circuitry. For example, a first clock signal, clk1, might drive one or more micro-controllers; a second clock signal, clk2, might drive a vector processor; a third clock signal, clk3, might drive hardware blocks; and a forth clock signal, clk4, might be used as a bus clock. For any given one of the clock operating points, each of the four different clock signals might operate at a different frequency. For example, a first operating point, OPP1, might result in:
clk1=416 MHz; clk2=312 MH; clk3=208 MHz; and clk4=104 MHz,
whereas a second operating point, OPP2, might result in:
clk1=208 MHz; clk2=156 MH; clk3=104 MHz; and clk4=52 MHz.

A similar situation can also exist with respect to voltage supply levels: alternative embodiments may involve the concurrent generation of a plurality of voltage supply levels to be used for respectively different parts of the circuitry. For any given state of the third signal referred to in FIG. 4, each of the generated voltage supply levels may be different from one another.

Thus, the described embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of generating a clock signal to be supplied to electronic circuitry, the method comprising:
   generating, based on which one of a plurality of application use cases capable of being carried out by the electronic circuitry is presently active, a first signal that indicates a first selected one of a plurality of clock signal operating points;
   generating, based on a present speed requirement of the electronic circuitry, a second signal that indicates a second selected one of the plurality of clock signal operating points;
   generating, based on the first and second signals, a third signal that indicates which of the plurality of clock signal operating points should be active, wherein the clock signal operating point indicated by the third signal is whichever one of the clock signal operating points indicated by the first and second signals is associated with a higher clock signal frequency; and
   using the third signal to control generation of a clock signal having the operating point indicated by the third signal,
   wherein for any given one of the application use cases, the present speed requirement need not remain constant for the duration of the given one of the application use cases,
   wherein the first selected one of the plurality of clock signal operating points can be associated with a higher clock signal frequency than a clock signal frequency associated with the second selected one of the plurality of clock signal operating points, wherein the second selected one of the plurality of clock signal operating points can be associated with a higher clock signal frequency than a clock signal frequency associated with the first selected one of the plurality of clock signal operating points, and wherein the second signal changes states while the first signal remains constant during the given one of the application use cases, whereby an average clock frequency during the given one of the application use cases is not equal to any one of a plurality of clock frequencies that respectively correspond to the clock signal operating points.

2. The method of claim 1, wherein:
the first signal further indicates a first selected one of a plurality of supply voltage levels;
the second signal further indicates a second selected one of the plurality of supply voltage levels;
the third signal further indicates which of the plurality of supply voltage levels should be active; and
the method comprises using the third signal to control generation of a supply voltage level having the supply voltage level indicated by the third signal.

3. The method of claim 1, wherein:
the first signal further indicates a first selected one of a plurality of supply voltage levels;
the second signal further indicates a second selected one of the plurality of supply voltage levels; and
the method comprises:
generating, based on the first and second signals, a fourth signal that indicates which of the plurality of supply voltage levels should be active, wherein the supply voltage level indicated by the fourth signal is the most power consuming one of the supply voltage level indicated by the first signal and the supply voltage level indicated by the second signal; and
using the fourth signal to control generation of a supply voltage level having the supply voltage level indicated by the fourth signal.

4. The method of claim 1, wherein:
the first signal has two states;
the second signal has two states; and
generating the third signal that indicates which of the plurality of clock signal operating points should be active comprises performing a logical OR between the first signal and the second signal.

5. The method of claim 1, wherein:
the first signal has more than two states; and
the second signal has more than two states.

6. The method of claim 1, wherein:
generating the first signal comprises using a programmed processor to select one of the plurality of clock signal operating points based on which of the plurality of application use cases is presently active; and
generating the second signal comprises using a hardwired component to generate the second signal based on the present speed requirement of the electronic circuitry.

7. The method of claim 6, wherein the hardwired component is a timing generator.

8. The method of claim 1, wherein:
the electronic circuitry is configured to perform functions in a mobile communication equipment; and
the present speed requirement of the electronic circuitry is a function of a timing characteristic of a signal received by the mobile communication equipment.

9. The method of claim 1, further comprising:
using the third signal to control generation of one or more other clock signals, each having the clock signal operating point indicated by the third signal, wherein for any given one of the plurality of clock signal operating points, the clock signal and the one or more other clock signals operate at different frequencies relative to one another.

10. The method of claim 1, further comprising:
using the third signal to control generation of one or more other supply voltage levels, wherein for any given one of the plurality of supply voltage levels, the generated supply voltage level and the generated one or more other supply voltage levels are different from one another.

11. The method of claim 1, comprising:
inhibiting generation of the second signal based on the present speed requirement of the electronic circuitry, and instead generating the second signal as a pulse width modulated signal having a duty cycle that is based on the presently active application use case.

12. The method of claim 11, comprising:
causing the first signal to remain in a deasserted state for the duration of the presently active application use case.

13. An apparatus for generating a clock signal to be supplied to electronic circuitry, the apparatus comprising:
circuitry configured to generate, based on which one of a plurality of application use cases capable of being carried out by the electronic circuitry is presently active, a first signal that indicates a first selected one of a plurality of clock signal operating points;
circuitry configured to generate, based on a present speed requirement of the electronic circuitry, a second signal that indicates a second selected one of the plurality of clock signal operating points;
circuitry configured to generate, based on the first and second signals, a third signal that indicates which of the plurality of clock signal operating points should be active, wherein the clock signal operating point indicated by the third signal is whichever one of the clock signal operating points indicated by the first and second signals is associated with a higher clock signal frequency; and
circuitry configured to use the third signal to control generation of a clock signal having the operating point indicated by the third signal,
wherein for any given one of the application use cases, the present speed requirement need not remain constant for the duration of the given one of the application use cases,
wherein the first selected one of the plurality of clock signal operating points can be associated with a higher clock signal frequency than a clock signal frequency associated with the second selected one of the plurality of clock signal operating points,
wherein the second selected one of the plurality of clock signal operating points can be associated with a higher clock signal frequency than a clock signal frequency associated with the first selected one of the plurality of clock signal operating points, and
wherein the circuitry configured to generate the second signal is configured to respond to changes in the present speed requirement that take place during the given one of the application use cases by changing the state of the second signal while the first signal remains constant during the given one of the application use cases, whereby an average clock frequency during the given one of the application use cases is not equal to any one of a plurality of clock frequencies that respectively correspond to the clock signal operating points.

14. The apparatus of claim 13, wherein:
the first signal further indicates a first selected one of a plurality of supply voltage levels;
the second signal further indicates a second selected one of the plurality of supply voltage levels;
the third signal further indicates which of the plurality of supply voltage levels should be active; and
the apparatus comprises circuitry configured to use the third signal to control generation of a supply voltage level having the supply voltage level indicated by the third signal.

15. The apparatus of claim 13, wherein:
the first signal further indicates a first selected one of a plurality of supply voltage levels;
the second signal further indicates a second selected one of the plurality of supply voltage levels; and
the apparatus comprises:
circuitry configured to generate, based on the first and second signals, a fourth signal that indicates which of the plurality of supply voltage levels should be active, wherein the supply voltage level indicated by the fourth signal is the most power consuming one of the supply voltage level indicated by the first signal and the supply voltage level indicated by the second signal; and
circuitry configured to use the fourth signal to control generation of a supply voltage level having the supply voltage level indicated by the fourth signal.

16. The apparatus of claim 13, wherein:
the first signal has two states;
the second signal has two states; and
the circuitry configured to generate the third signal that indicates which of the plurality of clock signal operating points should be active comprises circuitry configured to perform a logical OR between the first signal and the second signal.

17. The apparatus of claim 13, wherein:
the first signal has more than two states; and
the second signal has more than two states.

18. The apparatus of claim 13, wherein:
the circuitry configured to generate the first signal comprises a programmed processor configured to select one of the plurality of clock signal operating points based on which of the plurality of application use cases is presently active; and
the circuitry configured to generate the second signal comprises a hardwired component configured to generate the second signal based on the present speed requirement of the electronic circuitry.

19. The apparatus of claim 18, wherein the hardwired component is a timing generator.

20. The apparatus of claim 13, wherein:
the electronic circuitry is configured to perform functions in a mobile communication equipment; and
the present speed requirement of the electronic circuitry is a function of a timing characteristic of a signal received by the mobile communication equipment.

21. The apparatus of claim 13, further comprising:
circuitry configured to use the third signal to control generation of one or more other clock signals, each having the clock signal operating point indicated by the third signal, wherein for any given one of the plurality of clock signal operating points, the clock signal and the one or more other clock signals operate at different frequencies relative to one another.

22. The apparatus of claim 13, further comprising:
circuitry configured to use the third signal to control generation of one or more other supply voltage levels, wherein for any given one of the plurality of supply voltage levels, the generated supply voltage level and the generated one or more other supply voltage levels are different from one another.

23. The method of claim 13, comprising:
inhibiting generation of the second signal based on the present speed requirement of the electronic circuitry, and instead generating the second signal as a pulse width modulated signal having a duty cycle that is based on the presently active application use case.

24. The method of claim 23, comprising:
causing the first signal to remain in a deasserted state for the duration of the presently active application use case.

\* \* \* \* \*

UNITED STATES PATENT AND TRADEMARK OFFICE
CERTIFICATE OF CORRECTION

PATENT NO. : 8,799,698 B2
APPLICATION NO. : 13/118621
DATED : August 5, 2014
INVENTOR(S) : Singvall et al.

It is certified that error appears in the above-identified patent and that said Letters Patent is hereby corrected as shown below:

In the specification

In Column 9, Line 23, delete "unit 211" and insert -- unit 207 --, therefor.

In Column 9, Line 31, delete "unit 211" and insert -- unit 207 --, therefor.

Signed and Sealed this
Thirty-first Day of May, 2016

Michelle K. Lee
*Director of the United States Patent and Trademark Office*